United States Patent [19]

Sliwa et al.

[11] Patent Number: 4,962,060
[45] Date of Patent: Oct. 9, 1990

[54] MAKING A HIGH SPEED INTERCONNECT SYSTEM WITH REFRACTORY NON-DOGBONE CONTACTS AND AN ACTIVE ELECTROMIGRATION SUPPRESSION MECHANISM

[75] Inventors: Jack Sliwa, Los Altos Hills; Mohammad Farnaam, Santa Clara; Pankaj Dixit, Sunnyvale; Lewis N. Shen, Cupertino, all of Calif.

[73] Assignee: Advanced Micro Devices, Inc., Calif.

[21] Appl. No.: 346,050

[22] Filed: May 2, 1989

Related U.S. Application Data

[62] Division of Ser. No. 24,283, Mar. 10, 1987.

[51] Int. Cl.$^5$ ...................... H01L 21/44; H01L 21/48
[52] U.S. Cl. ................................... 437/192; 428/651; 357/67
[58] Field of Search ......................... 437/192; 357/67; 428/651, 660

[56] References Cited
FOREIGN PATENT DOCUMENTS
66628 3/2687 Japan.

Primary Examiner—Brian E. Hearn
Assistant Examiner—Laura Holtzman
Attorney, Agent, or Firm—David W. Collins

[57] ABSTRACT

An interconnect (16',18', 18"), whose interlevel contacts comprise refractory (10) to refractory or refractory to semiconductor substrate (13) interfaces, comprises patterned refractory core portions (10), consisting of tungsten or molybdenum, having top portions (10a) and opposed side portions (10b), provided with sidewall spacers (32a) of aluminum, gold or copper or alloys thereof and formed on surfaces (12a) of insulating layers (12). The sidewall spacers afford lateral low resistivity cladding of the refractory portions as well as suppression of the electromigration failure modes of voiding and whiskering, while leaving the top portion of the core portions available for refractory to refractory contacts and the bottom portion of the core portions available for refractory to refractory or refractory to silicon contacts. In this manner, an interconnect system is provided which has low electrical resistivity but which avoids the much poorer electromigration performance associated with aluminum to aluminum, aluminum to silicon, or aluminum to refractory contact-making as well as with industry-standard bilayer structures comprising refractory/aluminum for interconnect-making.

32 Claims, 4 Drawing Sheets

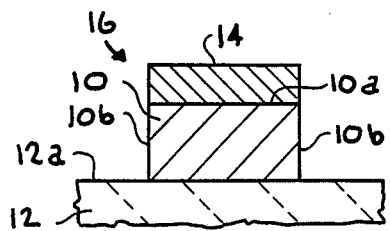
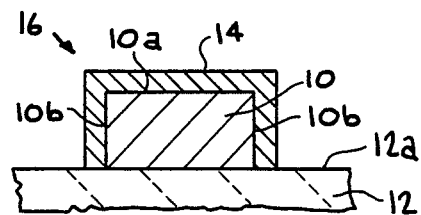
FIG. 1A (PRIOR ART)          FIG. 1B (PRIOR ART)
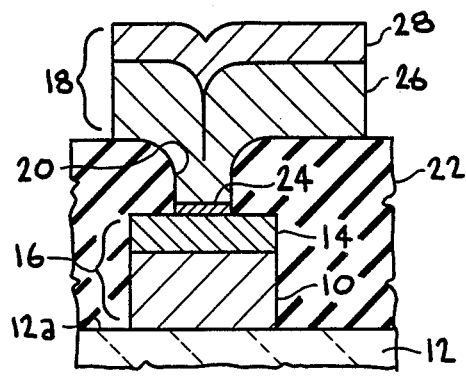
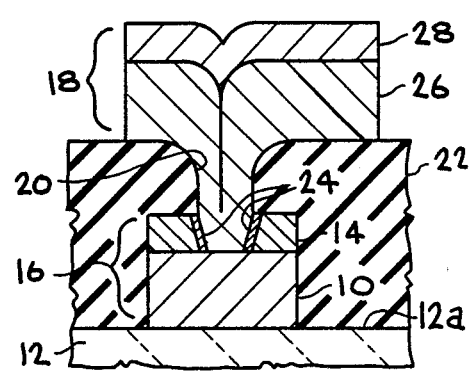
FIG. 2A (PRIOR ART)          FIG. 2B (PRIOR ART)
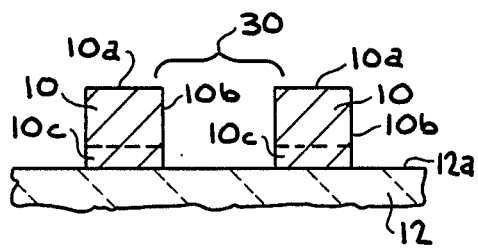
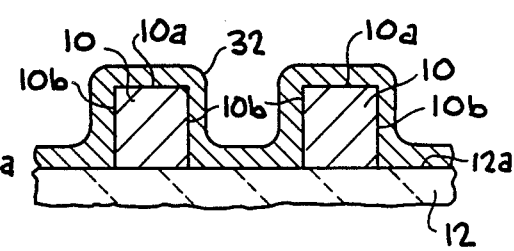
FIG. 3A          FIG. 3B
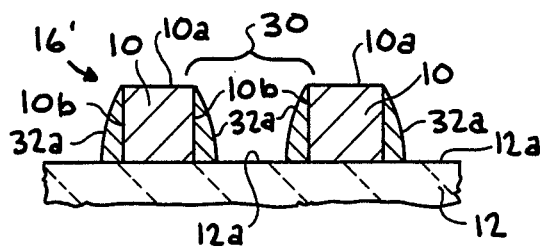
FIG. 3C

MAKING A HIGH SPEED INTERCONNECT SYSTEM WITH REFRACTORY NON-DOGBONE CONTACTS AND AN ACTIVE ELECTROMIGRATION SUPPRESSION MECHANISM

This is a division of application Ser. No. 024,283 filed Mar. 10, 1987.

BACKGROUND OF THE INVENTION

1. Field of the Invention

The present invention relates to interconnect schemes for semiconductor devices, and, more particularly, to an interconnect system for such devices evidencing exceptional reliability and high speed, not requiring dog-bone overlapping contacts.

2. Description of the Prior Art

In general, there is no single integrated circuit (IC) interconnect material which is highly electromigration stress-resistant, of low electrical resistivity and easy to pattern by dry etching. One potential future exception is gold, which, however, is very expensive, is presently impossible to pattern by dry etching and requires the use of complex adhesion layers and barriers.

The two remaining potential exceptions are tungsten and molybdenum, which have only moderately low resistivity but are patternable with dry etching and have extremely good electromigration resistance. Tungsten and molybdenum do not stick well to oxides and are often highly stressed. resulting in delamination. Tungsten, as deposited by chemical vapor deposition (CVD), can have resistivity as low as 10 $\mu\Omega$-cm, which is about three times that of aluminum. At the present time, CVD tungsten still requires an adhesion layer to make it stick to oxides. This is due to its inability to reduce $SiO_2$.

Thus, it appears that to have both exceptional reliability and high performance in an IC interconnect, some combination of electromigration-resistant tungsten (or molybdenum), as deposited by either CVD or sputtering and a low resistivity material for speed such as aluminum, gold or copper should be used together. As stated earlier, the use of gold (and the use of copper) presently precludes the use of dry etching given the restriction of using current photoresist masking technology, which limits etch temperature excursions. Without excessive temperature, copper cannot be dry-etched with good selectivity.

It has been proposed many times to clad CVD tungsten with either aluminum (by sputtering) or gold or copper (by sputtering or by plating). These approaches will serve to reduce the interconnect resistivity, yet will maintain a high resistance to electromigration-induced voiding and electrical open circuits, due to the presence of the refractory. However, these approaches add a host of new problems.

Recent reliability testing within the IC industry is showing that electromigration failures can take on a new form when aluminum is underlaid, overlaid, or interlayered with electromigration-resistant refractory metals such as titanium, titanium tungsten, titanium nitride, tungsten or molybdenum. What happens is that the refractory films do indeed eliminate electromigration-induced opens or voids from totally penetrating the entire clad metal sandwich of the interconnection. That is, the aluminum still migrates and voids, but the refractory portion of the interconnect does not.

Unfortunately, the aluminum migrates or moves even faster and more uniformly when the refractory is present because at least one new large area interface is available for aluminum to migrate in, i.e., the refractory/aluminum interface. Thus, electrical opens due to voids are eliminated at the expense of causing a new potential failure. That new potential failure is aluminum whisker formation. In short, the increased quantities of aluminum flowing along the line, and in the new interface, in the direction of the electron flow pile up at the end of the line and ultimately burst out in the form of aluminum whiskers, breaking adjacent dielectric overlayers and causing electrical shorts.

Thus, the concern about interconnect electromigration becomes one of short circuits, and testing can no longer be done on isolated interconnects as it can be for open circuits. This invention suppresses or eliminates the aluminum whisker problem while also solving the easier opens, or voiding, problem. In addition, this invention results in 100% tungsten to tungsten or tungsten to silicon contacts, which are greatly more electromigrationresistant than aluminum contacts while also increasing contact step coverage to 100% from the 25 to 50% range typical of conventional aluminum contacts. Better step coverage means better electromigration resistance due to lack of thickness reduction at steps.

Three periodically proposed variations of the clad tungsten (W) approach involve cladding the top of CVD tungsten with either aluminum or with gold (termed "capping") or cladding the top and sides termed "encapsulating") of CVD tungsten with gold (the tungsten having been previously deposited and patterned on a semiconductor substrate).

The first two variations produce a substantial increase in the aspect ratio of line height to line width as well as require the use of complex multistep plasma dryetching processes. The increase in thickness makes the already difficult task of later oxide planarization over the metal lines even more difficult. The third variation requires the use of gold plating, an anathema to IC processing engineers because of its ionic and organic dirtiness and difficulty of control.

Additionally, the use of gold in CMOS technology gives rise to extraordinary problems, since gold is an extremely efficient life-time killer in MOS devices. The use of gold also results in the lack of an interfacial adhesive bond between the gold and the overlying oxide. Thus, adhesion and the ingress of moisture along such interconnect/oxide interfaces becomes a reliability issue.

Furthermore, CVD tungsten as practiced today may employ a CVD tungsten silicide ($WSi_x$) or amorphous silicon $\alpha$-Si) adhesion layer, which would have negligible ability to prevent gold from penetrating into the device junctions even at very low temperatures of about 200° C.

Turning now to yet another electromigration problem, electromigration at contacts made to underlying silicon or contacts between metal layers is rapidly becoming another dominant failure mechanism. Such contacts, in the case where they incorporate undesirable contamination, are particularly unreliable. For example, forming intermetal contacts from a CVD tungsten or $WSi_x$ upper level interconnect down to an aluminum-capped lower level interconnect results in the formation in the tungsten/aluminum or $WSi_x$/aluminum interface of an aluminum fluoride compound having high electrical resistance.

This formation is due to the exposure of the aluminum to the $WF_6$ reactant in the CVD tungsten process chemistry. Such a dirty contact would fail quickly under electromigration stress compared to a clean aluminum to aluminum contact. The performance of a clean tungsten-to-aluminum contact would fall between the latter two in that a dissimilar refractory/aluminum interface, although not dirty, acts as a discontinuity as seen by moving aluminum atoms. It is always better to not have dissimilar materials forming abrupt contact interfaces when one material has poor electromigration resistance.

Although it may be argued that to avoid the above aluminum fluoride problem one could, during contact etching down to an aluminum-clad underlying tungsten interconnect, etch any exposed aluminum away, this is, in practice, very difficult to do without having problems with sidewall polymer formation on the aluminum cap being etched in the bottom of an already deep contact hole. The polymer sidewall residue formation in the narrow contacts, which must later see high temperature tungsten CVD chemistry, would be a major outgassing problem, and the ability of conventional contact sputter-etch precleaning before CVD to clean up the polymer would be very limited, due to its inaccessibility. Such polymers form on contact sidewalls as a consequence of normal aluminum etching processes designed to promote anisotropic etching and silicon or copper removal if aluminum doped with silicon and copper is used.

It may also be argued that such aluminum capping material may be wet-etched. Although no polymer will be formed, this approach makes corrosion a major problem, due to the inability to flush the etchant out of the contact hole.

Given that it would be extremely difficult to use an upper level CVD tungsten interconnect layer to make contact down to an aluminum clad tungsten underlying interconnect layer due to the aluminum fluoride and polymer/etching problems described above, what is really desired is the isolation of the aluminum from the contactetching and contact-forming operations. As stated earlier, the tungsten to tungsten and tungsten to silicon electromigration resistance of this approach is also desirable and significantly superior.

It might be argued that a simpler approach for fabricating the Al- or Au-clad CVD tungsten interconnects and contacts described above would be to use a larger thickness of the aluminum or gold cladding and a smaller thickness of CVD tungsten underneath. Unfortunately, it is desired to use as much CVD tungsten as possible to fill the contact vias because aluminum sputtering technology cannot get aluminum into high aspect deep contacts in a void-free manner without excessive RF biasing during deposition. The amount of tungsten necessary is (in thickness) something greater than the radius of the largest via needing filling.

Typically, no devices other than memories can be designed efficiently with one contact size, and in actuality, even memories have some large contacts for power and ground. Thus, in practice, all vias (contacts) on a given device cannot be totally plugged with tungsten. As a consequence, the larger contacts are not only not filled, but also become reentrant (i.e., undercut, with a negative slope). This is because tungsten CVD is not conformal and deposits less thickness at the bottom of a contact or groove, especially as this amount deposited increases.

In the prior art described, this will be an etch problem at edges where reentrant tungsten will mask aluminum located within the reentrant. This aluminum gets under such overhangs in typical aluminum sputtering processes. Reactive ion etching (RIE) of the aluminum as step 1 of the two step etch to pattern a tungsten interconnect overlaid with aluminum will not get to such hidden aluminum. During the second RIE step, the tungsten etch chemistry will stall on the hidden aluminum. Again, adjustments made to come up with an etch chemistry which attacks both layers equally results in more unwanted tradeoffs.

A final disadvantage of current prior art approaches described herein is that they require that during the etching of a given metal interconnect level, one must never permit the underlying interconnect layer to be exit posed to the etch. This has always been the case for conventional aluminum-only interconnects because the underlying layer being exposed in a contact could be attacked, undercut, or even eliminated. For the tungsten/aluminum system described above, it is even more of a problem because the amount and projected thickness of each metal in a contact varies with the degree of filling of each sublayer of the bilayer. By insuring that the contacts are always 100% covered by a dogbone-shaped pad of overlying metal, one avoids the problem at the expense of interconnect density. Underlying metal is thus always protected by overlying metal pads at contacts.

Summarizing the foregoing problems presently encountered in attempting to fabricate 100% tungsten to tungsten or tungsten to silicon contacts of exceptional reliability while also forming an interconnect impervious to both electromigration opens and shorts and having high speed, it is seen that CVD tungsten chemistry poisons aluminum contacts with aluminum fluoride which ruins reliability and contact resistance, while etching through an aluminum cap causes polymer or corrosion problems. Reentrants in CVD tungsten cause aluminum etch ribbons. The prior art, as described, has not addressed the problem of aluminum whiskers at all. Current practice precludes elimination of dogbones to gain packing density.

SUMMARY OF THE INVENTION

Accordingly, it is an object of the present invention to provide 100% refractory or refractory/silicon contacts that are known to be exceptionally reliable.

It is another object of the present invention to provide an interconnect which still takes advantage of the resistance-reducing properties of the aluminum cladding of the refractory but to avoid a two-step bilayer etching process prone to etch-ribbon problems.

It is yet another object of the present invention to provide an interconnect which deals with all three electromigration problems, i.e., contact electromigration as well as interconnect opens and interconnect whisker-shorts.

It is a further object of the present invention to provide a contact and interconnect having improved aspect ratios and/or shapes for easier planarization and contactmaking.

It is a still further object of the present invention to eliminate contact dogbones, thus increasing interconnect packing density.

It is yet a further object of the present invention to more fully fill contact holes with refractory metal for the best possible electromigration resistance in small-diameter contacts.

In accordance with the invention, the interconnects comprise patterned refractory (tungsten or molybdenum) cores whose sidewalls are covered with low resistivity fillets of aluminum, gold or copper to provide lateral low resistivity cladding. The top surface of the core is left unclad for the purpose of achieving upward refractory to refractory contacts, while the bottom surface of the core is left unclad for the purpose of achieving downward refractory to refractory or refractory to semiconductor contacts. The separate sidewall claddings or sidewall "spacers" offer a unique way to not only improve later oxide planarization but also to inhibit and suppress the onset of whisker formation and voiding due to electromigration.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1a–b depict, in perspective, prior art clad CVD tungsten lines formed on a semiconductor substrate;

FIGS. 2a–b depict, in cross-section, formation of undesirable aluminum fluoride compounds and/or etch polymer in prior art schemes;

FIGS. 3a–c depict, in cross-section, the process sequence in accordance with the invention;

FIG. 5b is an electrical resistance model of the lateral-clad line of FIG. 5a;

FIG. 7b depicts, in cross-section, the profile of the model employed in producing the plot of FIG. 7a.

DETAILED DESCRIPTION OF THE INVENTION

Figure 4:
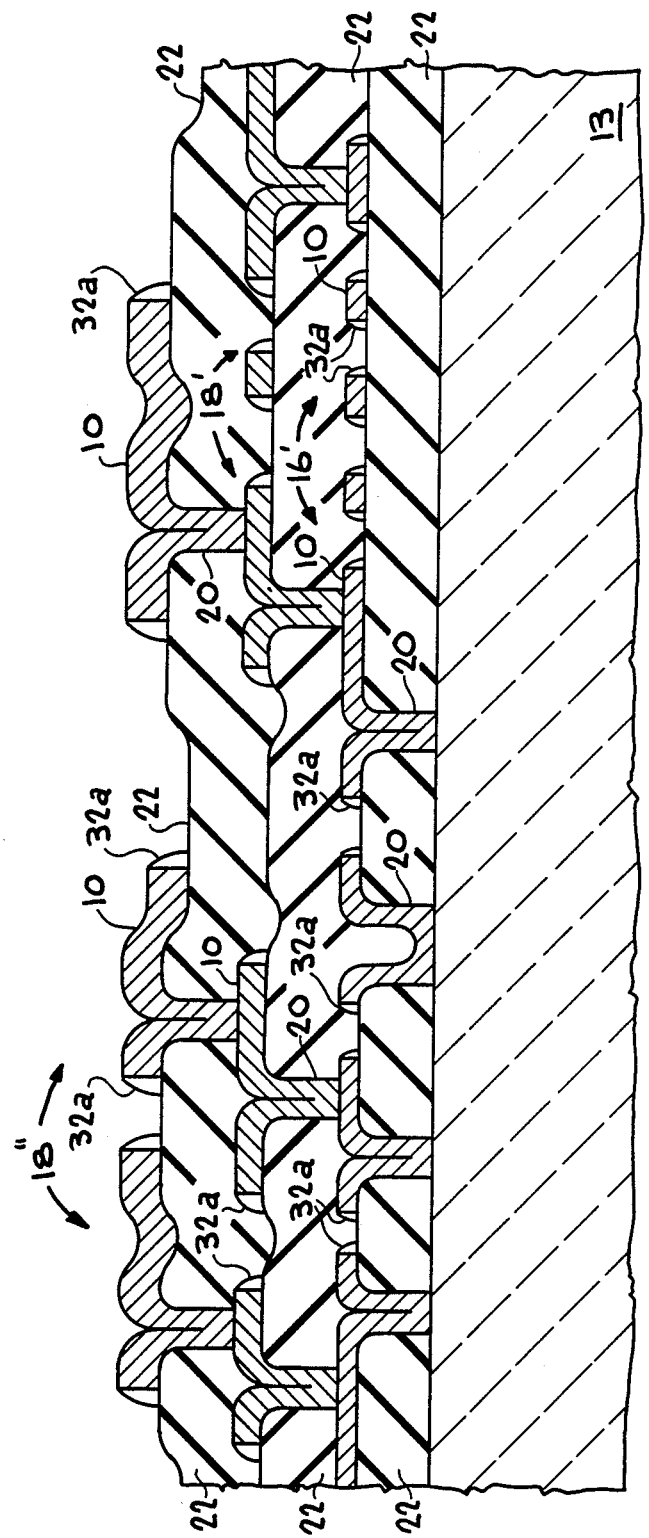
FIG. 4 depicts, in cross-section, one implementation of the invention, using a triple level metal scheme.

FIGS. 1a and 1b depict prior art CVD tungsten lines 10 formed on the surface of a layer 12, such as silicon dioxide. The tungsten lines 10 are provided with a metal cladding 14 to together provide a low resistance, electromigration-resistant interconnect 16. What is meant by electromigration resistant here is resistance to opens by voiding, not resistance to whisker-induced shorts.

The metal cladding 14 is formed either as a cap on the top portion 10a of the tungsten line 10 (FIG. 1a) or as an encapsulation on the top and sides 10b of the tungsten line (FIG. 1b). The cap may comprise aluminum, gold or copper, while the encapsulation usually comprises plated gold or copper.

Connecting upper-level interconnects 18 down to the underlying lower level interconnects 16 through a contact hole or via 20 in an insulating layer 22 can result, as described earlier, in the formation of aluminum fluoride compounds 24 where a tungsten layer 26 is the first layer of the upper layer interconnect and is deposited by CVD employing $WF_6$. The aluminum fluoride forms either at the bottom of the contact hole 20, as shown in FIG. 2a. or along the sides of the aluminum layer 14 if an attempt is made to etch through the aluminum layer to the underlying CVD tungsten line 10, as shown in FIG. 2b.

If upper level tungsten 26 were deposited by sputtering rather than by CVD, the aluminum fluoride would not form. However, during the etching of the aluminum cap 14 in FIG. 2b, there would be etch polymer formation at the same locations 24. The structure 2A would have much less polymer formation, but sputtered tungsten will not fill the contact without voiding. In FIGS. 2a and 2b. the second level metal 18 comprises CVD tungsten overlaid with aluminum 28 in identical fashion with the first metal interconnect 16, comprising CVD tungsten overlaid with aluminum 14.

Reference is now made in detail to a specific embodiment of the present invention which illustrates the best mode presently contemplated by the inventors for practicing the invention. Alternative embodiments are also briefly described as applicable.

The processing sequence in forming the interconnect of the invention is depicted in FIGS. 3a–c. There, tungsten lines 10 (in cross-section) are shown formed on the surface of a layer 12, such as silicon dioxide, in FIG. 3a. Alternatively, the layer 12 may comprise reflowed phosphosilicate glass (PSG) or reflowed borophosphosilicate glass (BPSG) or doped/undoped non-reflowed interlevel oxide or nitride, oxynitride, polyimide, arsenic-doped glass, spin-on silicate or siloxane glass or amorphous silicon, depending on which metal interconnect layer is being considered and what device technology is being employed. While CMOS technology is depicted herein, other device technologies, such as GaAs or bipolar, Would employ similar underlying oxides or nitrides or polyimides.

The lines 10 called core regions herein, may comprise tungsten, $WSi_x/W$ or $\alpha$-Si/W and are deposited by CVD, employing conventional process parameters. In FIG. 3a, an optional tungsten adhesion layer 10c comprises a CVD $\alpha$-Si or $WSi_x$ film or alternatively a sputtered adhesion and contacting layer comprising titanium nitride or titanium/titanium nitride. There are numerous other films which can also serve the same purpose of layer 10c. Optional use of molybdenum rather than tungsten and bias-sputter deposition rather than CVD has been previously described herein for implementation of core 10.

The lines 10 are printed and etched to final linewidth dimensions more narrow than is normally the case for the given line pitch, providing line spacing as denoted by 30. The degree of undersizing is erased upon the implementation of the sidewall cladding. Thus, after sidewall cladding, the line/space dimensions are approximately those of current practice, although using the teachings of the invention, one can, with manufacturing control, have wider lines for a given pitch than is currently possible. Thus, for a given pitch, or center to center line spacing, the invention permits a wider and faster interconnect in situations where lateral capacitance is not dominating propagation speed.

The final linewidth is now the sum of the width of the tungsten core 10 plus twice the lateral spacer 22a width. It will be noted in the prior art FIG. 1b that the fully encapsulated core must also be printed and etched in the same undersized manner. The degree of undersizing is greater for this invention than that of FIG. 1b because all of the low resistivity encapsulant is laterally situated. Thus, the lateral encapsulant 32a is referred to herein as sidewall material or sidewall cladding, because it is generally found only at those locations, not on top of the core 10.

As an example, for a 2 μm pitch interconnect with 1 μm lines and 1 μm spaces, the aluminum sidewall maximum thickness per edge would range from 0.05 to 0.25 μm, giving a tungsten core undersized by 0.1 μm and 0.50 μm, respectively.

The lateral sidewall metal layer 32 is initially deposited everywhere, covering the top 10a and opposed sides 10b of the tungsten lines 10, as well as the exposed portions of the surface 12a of layer 12, as shown in FIG. 3b. The metal 32 comprises aluminum, gold or copper. However, minor additions of various alloying elements to these metals providing low resistivity alloys may also be employed and it will be understood that discussion of the particular metals 32 also includes their alloys. Examples of suitable alloys include aluminum-0.5% copper, aluminum-1% silicon-0.15% titanium, and gold-x% palladium, where x ranges from about 1 to 5%, which are industry-standard alloys. Further, combinations of the metals are also contemplated, such as the deposition of copper by electroless plating, followed by electroless or electroplating of gold thereover for corrosion resistance.

In the case of aluminum, the deposition technique may be evaporation, sputtering, bias-sputtering or CVD. The most desirable conformal coatings will be obtained with the sputtering or CVD methods, with or without bias. In the case of gold or copper, the deposition technique may be the same if a dry-etching process for layer 32 is available, or if not, then a selective deposition on the sidewalls 10b only, using an electroplating or electroless plating technique with a plating mask employed on the tops 10a of the lines 10 and on the surface 12a in the case of electroplating because a temporary continuous metal film on surface 12a would be necessary to form the closed current loop for this known industry-standard method of electroplating on wafers.

As necessary, as is the case for sputtered aluminum, the metal 32 is removed from the top 10a of the tungsten lines 10 and from the exposed portions of the surface 12a, leaving metal sidewall spacers 32a along the side portions 10b of the tungsten lines, thereby affording lateral cladding thereof, as shown in FIG. 3c, to produce interconnect structure 16'. The removal of the low resistivity metal 32 from the horizontal surfaces 10a and 12a is most easily accomplished for aluminum using anisotropic reactive ion etching (RIE). Directional wet etching in a jet-spray system may also be employed.

As described in the case of gold or copper, there are considerable manufacturing difficulties associated with directional anisotropic plasma etching, and unless the poor etch selectivity of ion beam etching or sputter etching can be tolerated or the marginal anisotropic behavior or quasi-directional wet spray etching can be tolerated, it is probably best to selectively deposit by electroless plating or electroplating the sidewall metal 32, avoiding the etch issue completely. The plating mask described above, in the case of electroless plating, may comprise the same mask used to etch the core 10.

It will be noted that the tungsten deposition and etch processes are completed before the aluminum deposition and etch processes. It will also be noted that during tungsten deposition by CVD, there is no exposed aluminum. Thus, all of the problems previously described involving polymer formation, aluminum fluoride formation, and the difficulties of etching two metal layers in the same etch operation are totally avoided.

FIG. 4 shows a triple level metal scheme based on the invention. Metal 1 (16'), metal 2 (18') and metal 3 (18") are shown as practiced in this invention. The first thing to notice is tat the interlevel metal to metal contacts all comprise tungsten 10 to tungsten 10 interfaces, with the sidewall low resistivity material 32a not taking part in contact-making anywhere. The metal 16' to substrate 13 contacts comprise interfaces between the material of the core 10 and silicon. Further, it will be recalled that the core 10 may include an adhesion or adhesion/contacting layer 10c underneath, in which case the substrate contacts are interfaces between layer 10c and substrate 13.

The interconnects in FIG. 4 could operate at much greater current densities than $2 \times 10^5$ amps/cm$^2$ (typical of the prior art interconnects) without unacceptable RC delays or IR drops. The permitted increases in current density could translate into much better performance or, alternatively, if current density is not increased, to much better reliability at $2 \times 10^5$ amps/cm$^2$ or a combination of both at an intermediate current density.

The invention permits the designer to have both low resistivity and high current with much less concern about electromigration failure due to spiking or voiding of contacts or voiding or whiskering of interconnect traces. It is a feature of this invention to specifically offer an option wherein after the sidewall coating 32 is applied and before the anisotropic etch on the material 32 is performed to give sidewall coatings 32a, one performs a normal photolithography step to pattern material 32 in regions not directly on top of the tungsten core material 10, thus realizing an interconnect structure with both sidewall clad interconnects and interconnects consisting entirely of material 32 of minimum resistivity.

Figure 5A:
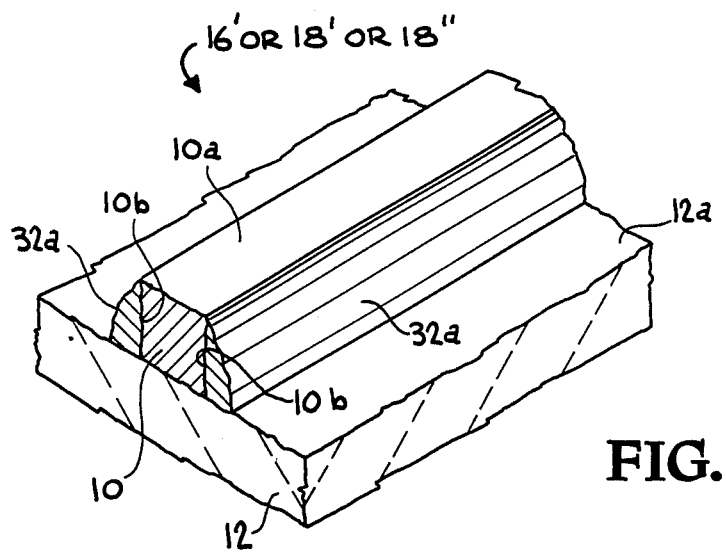
FIG. 5a is a perspective view of a laterally-clad CVD tungsten line in accordance with the invention.
Figure 5B:
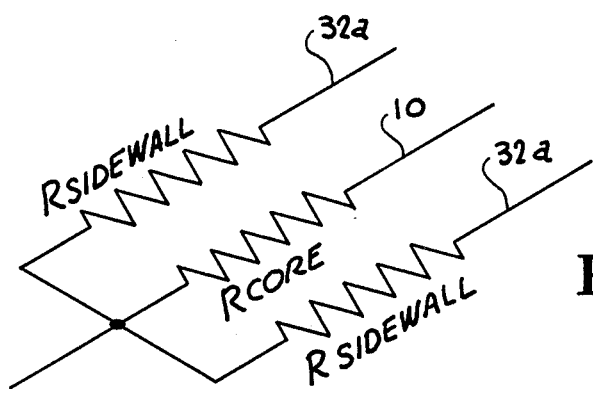
Figure 5C:
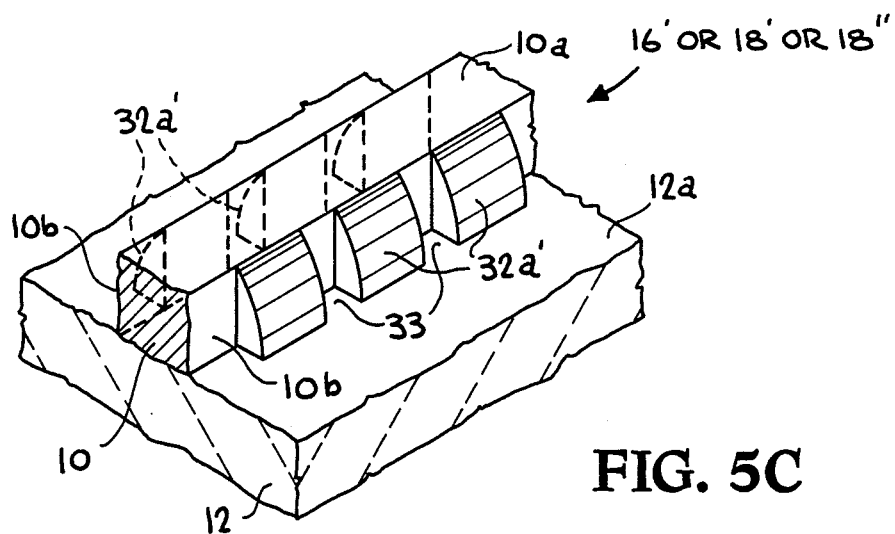
FIG. 5c is a perspective view of a laterally-clad CVD tungsten line whose cladding is segmented in accordance with another embodiment of the invention.

It is also an option to employ this separate masking step for material 32 to form a discontinuous sidewall cladding 32a' as shown in FIG. 5c, rather than a continuous sidewall cladding 32a shown in FIG. 5a. A major advantage of this approach is that material 32 is not offered a continuous electromigration path along the entire length of the line. Short segments 32a', especially if they are kept shorter than the critical length for electromigration (which has been calculated in the prior art literature), will virtually never fail. The gaps 33 between segments 32a' would be kept to minimum size in order the keep the resistance of the total structure to a minimum.

A major additional advantage of the dual sidewall cladding scheme of the invention is that the aluminum shunting is electrically redundant and physically independent at each location along the tungsten line 10 so that as the aluminum begins to migrate along one side, there is an alternative lower resistance path on the opposite sidewall. The tungsten line 10 with lateral cladding 32a is shown in FIG. 5a, and the corresponding resistance model is depicted in FIG. 5b. Since the onset of void formation causes locally high resistance on one edge, the opposite independent edge will act to shunt the current, thus suppressing the continued growth of the original void. It is statistically unlikely that two voids will simultaneously nucleate exactly opposite each other. Thus, the onset of killer voids and whiskers is delayed because void formation and growth is suppressed due to the electrical current having preference to circumvent high resistance regions.

This complementary pseudo-independent current-carrying ability of the opposite-facing sidewall spacers is due to the fact that the core material 10 is of significantly higher resistance than the sidewall material 32. Thus, current will locally switch from side to side as voids form and grow and avoid the core if possible.

In the case of segmented sidewall 32a' as depicted in FIG. 5c, it becomes possible to relatively position the segments along the length of the core 10 such that an optimum trade-off between total resistivity and electromigration can be obtained for the given current density. The optimum location of the slots 33 (FIG. 5c) will be partially determined not only by current density but also by the current waveform and its related impact on joule heating (that is, $I^2R$ losses).

A lithographic advantage is also gained employing the teachings of the invention. Instead of the usual narrowing of spaces and widening of lines on the mask to compensate for etch and lithography biases, in this approach, the current bias corrections to the mask would be of opposite sign to increase the spaces and make the lines easier to print. The fact that the sidewall spacer 32a may take on a tapered or rounded form as shown in FIGS. 3c, 4, 5a, 5c, 6 and 7b makes the job of depositing planar oxide 22 over the individual interconnect layers considerably simpler. For patterning the narrower tungsten cores or lines 10, the exposed and developed resist lines would be maintained as rectangular cross-sections by employing known high resolution lenses and exposure wavelengths. For example, for a core 10 having 0.8 $\mu$m width, one could use a numerical aperture 0.42 lens with G-line illumination. Bilayer resist processes would be able to deal with excessive topography.

The fact that in this invention the aluminum 32a is not severely mechanically constrained since half of its surface area is exposed will help reduce the driving force for hillock formation during fabrication. In conventional approaches, wherein a refractory is overlaid on aluminum, there are severe lateral hillock problems due to stress build-up in the constrained aluminum. Lateral hillocks cause shorts between closely spaced lines.

Of great advantage is that the sidewall coating 32a of aluminum is metallurgically and physically isolated from all intermetal and substrate contact vias. This means that there is no concern about contact electromigration or contact spiking and leakage due to the uptake of silicon by aluminum or the migration of junction silicon into aluminum.

Figure 6:
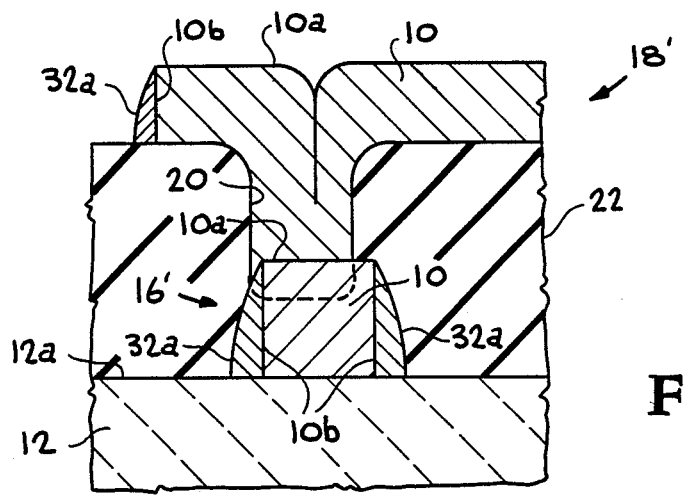
FIG. 6 is a cross-sectional view showing that overetching the contact of the invention is not harmful.

FIG. 6 shows the result of the contact etch process etching into the tungsten core 10 of an underlying interconnect 16'. It is to be noted that penetration of the lower level 16' tungsten material 10 only serves to further increase contact interfacial area, which is desirable.

In the case of using segmented sidewall spacers 32a' (FIG. 5c), the aluminum sidewall material may be removed at all contact locations. In the case of non-segmented sidewall spacer 32a (FIG. 5a), the aluminum will be exposed when etching a contact hole from above (FIG. 6).

If the design rule dimensions are such that the majority of the underlying interconnect 16' being exposed during contact etching consists of sidewall 32a as would be the case with bad alignment, then the sidewall material exposed by contact-etching of contact via 20 may be etched away during etching of the contact. This would require the addition of a chlorine-based etch step after the contact via 20 is open. Both the core 10 and the sidewall 32a would be etched. A positive aspect of this is that there would be virtually no chance of having unopened contacts. An option exists to overcoat core 10 before its patterning with a material not attacked by aluminum etching. An example would be a core 10 capped by tungsten silicide, a practice common to this art. Thus, in FIG. 6, instead of etching into the core 10 without attacking aluminum sidewall 32a, one would remove 32a without attacking core 10. The choice of etching into the core 10 as shown in FIG. 6 exists regardless of whether sidewall 32 is left in place in the contact bottom or not.

In term of lateral parasitic capacitance between metal lines, the average spacing which would exist with the clad (cap or encapsulated) prior art tungsten interconnect described above and with the approach of the present invention would be the same, if not slightly greater in the present invention. Thus, lateral capacitance would be about the same or slightly less. Accordingly, as with the prior art, the RC time constant, and more particularly, the resistance R, would drop in direct relation to the fractional amount of aluminum that can be incorporated into the cross-section, regardless of its arrangement (i.e., sidewalls vs. cap vs. encapsulation), assuming the total cross-sectional area is held constant.

The maximum fractional amount of aluminum which is usable is determined by how narrow the core 10 can be fabricated and by at what point aluminum, or spacer material 32a, begins to contribute to the makeup of the contact interfaces. Obviously, some aluminum in the contacts is tolerable. The option not to have any is available. The freedom to allow the contact hole 20 to be larger than normal and fall off the underlying metal 16' and be partially exposed from above after the overlying interconnect 18' is patterned permits the reduction/elimination of dogboning.

The CVD tungsten plug material 10 of an upper level 18' would refill any holes caused by exposure to etch of the core material 10 or sidewall material 32a of the underlying interconnect 16' during the etching of the intermetal via contacts 20. If the etching of the core 10 of the upper metal 18' is such that the entire contact 20 is not covered by material 10 of 18', then the edges of the core 10b of metal 18' will lay over contact 20. So long as sufficient core material 10 remains in the hole 20 to be electrically satisfactory, there is no manufacturability problem.

Figure 7A:
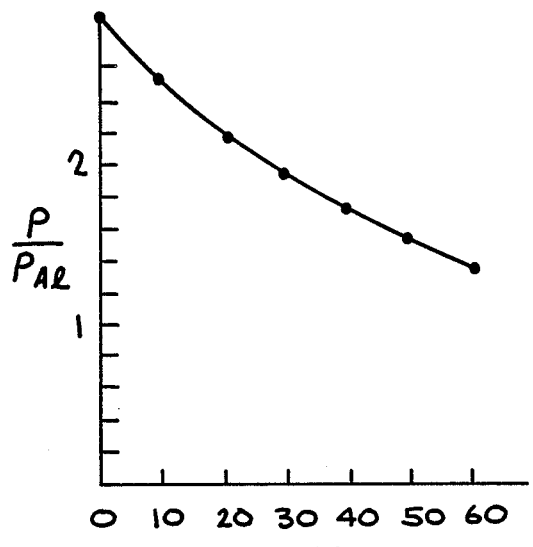
FIG. 7a, on coordinates of relative resistivity (resistivity relative to that of aluminum) and fractional aluminum areal content, is a plot of the amount of aluminum needed (in percent) to achieve a particular interconnect resistivity expressed in terms of a ratio to the resistivity of 100% aluminum.
Figure 7B:
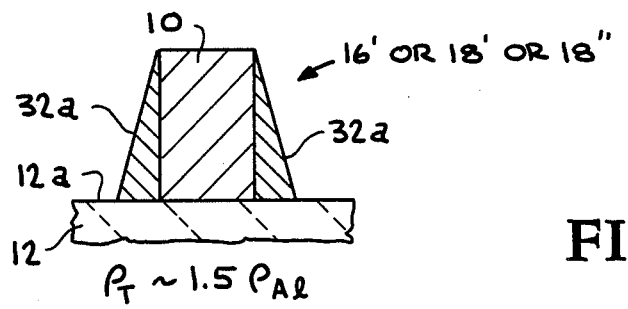

An analysis of resistance reduction with varying areal fractions of aluminum in the interconnect line cross-section, based on the reasonable assumption of parallel electrical resistances shown in FIG. 5b is plotted in FIG. 7a. As seen in FIG. 7a, an increase in the amount of aluminum produces a substantial decrease in the resistance of the tungsten/aluminum interconnect trace. FIG. 7b depicts the cross-sectional model employed in the analysis, wherein the sidewall portions 32a are assumed to be triangular for the simplicity of an approximate calculation. It is to be noted that in reality, the triangular section underestimates reality, making the graph of FIG. 7a a conservative estimate.

It will be noted that for a 1 μm line/1 μm space structure with 1 μm film thickness, the "sheet" resistance of the interconnect scheme of this invention compares favorably with a conventional film comprising 500 Å Ti/1,000 Å TiN/8,500 Å Al alloy, wherein $$1/R_T = 1/R_{Ti} + 1/R_{TiN} + 1/R_{Al} \text{ (per FIG. 5b)}$$

and the overall effective resistivity can be calculated as $$\rho_T \sim 1.17 \rho_{Al}.$$

That is, use of the Ti/TiN barrier causes the structure to have an effective resistivity 17% higher than that of the equivalent 100% aluminum interconnect.

Comparing the 50% (areal fraction) aluminum version of this invention having an effective resistivity of about 1.5 $\rho_{Al}$ and the conventional barrier/aluminum approach with 1.17 $\rho_{Al}$, it is seen that a resistivity penalty of only about 30% is present. That is, one obtains an interconnect system having nearly equivalent resistivity but considerably more reliability.

It will be appreciated that the process for forming the contact scheme of the invention requires no sloped oxide etching, due to the inherent ability of CVD tungsten to fill cylindrical vias with 100% step coverage. Thus, area is conserved and density can be increased.

An etch chemistry sequence has been developed that permits fabrication of the interconnect of the invention. The details of this chemistry are now described.

An anisotropic tungsten etch is employed to form the tungsten lines 10. Such an etch may comprise $CF_4 + \sim 10\% O_2$ or $SF_6 + He$. Many fluorinated gases will etch tungsten satisfactorily. The etching is carried out in a plasma (RIE mode) at low pressure and medium power or at higher pressure and higher power in a plasma mode.

Aluminum 32 is removed from the top 10a of the tungsten lines 10 and from between the lines on the oxide surface 22 by a resistless blanket RIE employing either $Cl_2 + BCl_3$, which forms little polymer, or $SiCl_4 + CHCl_3 + Cl_2$, which forms some sidewall polymer. The plasma RIE mode at low pressure and high power gives the best results. The former etchant should be run in a sputtering mode to help clean up residual copper from the aluminum. The latter etchant results in the formation of polymer and is anisotropic. The degree of anisotropy determines how much of metal 32 originally deposited on the sidewalls 10b remains to form the cladding 32a. A highly anisotropic etch combined with a conformally coated layer of metal 32 results in the greatest degree of linewidth and overall resistivity control. This is because the sidewall cladding is not attacked by the etch.

Passivation is performed in $CF_4$ or $CHF_3$ plasma at high pressure and low power.

Oxide etching to form contact holes 20 is done by RIE or plasma etching, using $CHF_3 + O_2$ or $CHF_3 + C_2F_6 + He$ at low or high pressure and medium to high power.

If one chooses to etch into the exposed tungsten core 10 of the underlying interconnect 16' without attacking any exposed aluminum sidewall 32a (FIG. 6), then that tungsten etching is done either by RIE, using $CF_4 + O_2$ at low pressure and medium power, or by wet etching in a mildly basic solution. The tungsten etch should be one that is selective to $SiO_2$ or one that etches $SiO_2$ anisotropically.

Any aluminum 32a clean-up is done by using the aluminum etch described above. A combined etch which attacks both the aluminum and tungsten is also an option. The objective is, however, to end up with contact interfaces consisting mainly of tungsten.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method of forming an interconnect structure on an integrated circuit formed on a semiconductor substrate having excellent reliability and high speed, comprising forming at least one patterned refractory core portion on an insulating layer, said core portion having a top portion and opposed side portions, said method comprising providing said core portion with sidewall spacers of at least one material selected from the group consisting of aluminum, gold and copper and alloys thereof, thereby affording lateral cladding of said refractory core portions, and exposing said top portion thereof.

2. The method of claim 1 wherein said insulating layer is selected from the group consisting of undoped or doped oxides, nitride, oxynitride, polyimide, spin-on silicate and siloxane glasses and amorphous silicon.

3. The method of claim 2 wherein said insulating layer comprises silicon dioxide doped with a material selected from the group consisting of phosphorus, boron/phosphorus and arsenic.

4. The method of claim 1 wherein said refractory material comprises a material selected from the group consisting of tungsten, molybdenum, $WSi_x/W$ and $\alpha$-$Si/W$.

5. The method of claim 4 wherein said refractory metal comprises tungsten.

6. The method of claim 1 wherein said sidewall material comprises aluminum or an alloy thereof.

7. The method of claim 1 wherein said sidewall material is blanket deposited, regions of said material not associated with said core portion are patterned, and said material overlying and lying between said core portions and said material outside said patterned regions is removed, leaving core portions with said lateral cladding and patterned lines comprising said material.

8. The method of claim 1 wherein said semiconductor comprises silicon.

9. The method of claim 1 wherein said sidewall material is formed as segments, comprising discontinuous sections thereof.

10. The method of claim 9 wherein said sections are formed shorter than the critical length for electromigration of said material.

11. The method of claim 1 wherein said sidewall comprises cladding one of said low resistivity materials by at least another of said low resistivity materials.

12. The method of claim 11 wherein a first cladding is formed by deposition of copper on said refractory core, followed by a second cladding formed by deposition of gold thereon.

13. The method of claim 1 wherein an adhesion layer is formed on said insulating layer prior to forming said refractory metal thereon.

14. The method of claim 13 wherein said adhesion layer comprises a material selected from the group consisting of $\alpha$-Si, $WSi_x$, titanium nitride and titanium/titanium nitride.

15. A method of forming an interconnect structure having excellent reliability and high speed comprising forming at least one patterned CVD tungsten core portion on an insulating layer, said portion having a top portion and opposed side portions, said method comprising providing said core portion with sidewall spacers of aluminum or an alloy thereof, thereby affording lateral cladding of said tungsten portions and exposing said top portion thereof.

16. The method of claim 15 wherein said insulating layer is selected from the group consisting of undoped or doped oxides, nitride, oxynitride, polyimide, spin-on silicate and siloxane glasses and amorphous silicon.

17. The method of claim 16 wherein said insulating layer comprises silicon dioxide doped with a material selected from the group consisting of phosphorus, boron/phosphorus and arsenic.

18. A method of forming an interconnect structure on an integrated circuit formed on a semiconductor substrate having excellent reliability and high speed, comprising forming at least one patterned refractory core portion on an insulating layer, said core portion having a top portion and opposed side portions, said method comprising blanket depositing sidewall material selected from the group consisting of aluminum, gold and copper and alloys thereof, patterning regions of said material not associated with said core portion, and removing said material overlying and lying between said core portions and said material outside said patterned regions, leaving core portions with lateral cladding and leaving patterned lines comprising said material.

19. The method of claim 18 wherein said insulating layer is selected from the group consisting of undoped or doped oxides, nitride, oxynitride, polyimide, spin-on silicate and siloxane glasses and amorphous silicon 20. The method of claim 19 wherein said insulating layer comprises silicon dioxide doped with phosphorus, boron/phosphorus, and arsenic.

21. The method of claim 18 wherein said refractory material comprises a material selected from the group consisting of tungsten, molybdenum, $WSi_x$/W and $\alpha$-Si/W.

22. The method of claim 21 wherein said refractory metal comprises tungsten.

23. The method of claim 18 wherein said sidewall material comprises aluminum or an alloy thereof.

24. The method of claim 18 wherein said semiconductor comprises silicon.

25. The method of claim 18 wherein said sidewall material is formed as segments, comprising discontinuous sections thereof.

26. The method of claim 25 wherein said sections are formed shorter than the critical length for electromigration of said material.

27. The method of claim 18 wherein said sidewall comprises cladding one of said low resistivity materials by at least another of said low resistivity materials.

28. The method of claim 27 wherein a first cladding is formed by deposition of copper on said refractory core, followed by a second cladding formed by deposition of gold thereon.

29. The method of claim 18 wherein an adhesion layer is formed on said insulating layer prior to forming said refractory metal thereon.

30. The method of claim 29 wherein said adhesion layer comprises a material selected from the group consisting of $\alpha$-Si, $WSi_x$, titanium nitride and titanium/titanium nitride.

31. A method of forming an interconnect structure having excellent reliability and high speed, comprising forming at least one patterned tungsten core portion on a surface of silicon dioxide, said core portion having a top portion and opposed side portions, said method comprising blanket depositing sidewall material comprising aluminum or an alloy thereof, patterning regions of said material not associated with said core portion, and removing said material overlying and lying between said core portions and said material outside said patterned regions, leaving core portions with lateral cladding and leaving patterned lines comprising said material.

32. The method of claim 31 wherein said surface comprises silicon dioxide doped with a material selected from the group consisting of phosphorus, boron/phosphorus, and arsenic.

* * * * *